US006939756B1

(12) United States Patent  (10) Patent No.: US 6,939,756 B1
Chung et al.  (45) Date of Patent: Sep. 6, 2005

(54) INCLUSION OF NITROGEN AT THE SILICON DIOXIDE-SILICON CARBIDE INTERACE FOR PASSIVATION OF INTERFACE DEFECTS

(75) Inventors: Gilyong Chung, Tampa, FL (US); Chin Che Tin, Auburn, AL (US); John R. Williams, Opelika, AL (US); Kyle McDonald, Nashville, TN (US); Massimiliano Di Ventra, Blacksburg, VA (US); Robert A. Weller, Brentwood, TN (US); Sokrates T. Pantelides, Franklin, TN (US); Leonard C. Feldman, Nashville, TN (US)

(73) Assignees: Vanderbilt University, Nashville, TN (US); Auburn University, Auburn, AL (US)

( * ) Notice: Subject to any disclaimer, the term of this patent is extended or adjusted under 35 U.S.C. 154(b) by 434 days.

(21) Appl. No.: 09/818,193

(22) Filed: Mar. 26, 2001

Related U.S. Application Data

(60) Provisional application No. 60/192,009, filed on Mar. 24, 2000.

(51) Int. Cl.[7] .......................................... H01L 21/3115
(52) U.S. Cl. ....................... 438/198; 438/285; 438/287; 438/591; 438/931
(58) Field of Search ................................. 438/198, 285, 438/289, 591, 931, FOR 202

(56) References Cited

U.S. PATENT DOCUMENTS

| | | | | |
|---|---|---|---|---|
| 5,821,172 A | * | 10/1998 | Gilmer et al. | 257/E29.162 |
| 6,051,509 A | * | 4/2000 | Tsuchiaki | 438/758 |
| 6,221,700 B1 | * | 4/2001 | Okuno et al. | 438/151 |
| 6,265,327 B1 | * | 7/2001 | Kobayashi et al. | 438/765 |
| 6,297,172 B1 | * | 10/2001 | Kashiwagi | 438/773 |
| 6,767,843 B2 | * | 7/2004 | Lipkin et al. | 438/758 |
| 2004/0101625 A1 | * | 5/2004 | Das et al. | 427/378 |

OTHER PUBLICATIONS

Jarnet, P., et al, "Physical Properties of N2O and NO–Nitrided Gate Oxides Grown on 4H–SiC", Appl. Phys. Lett. vol. 79, No. 3, Jul. 16, 2001, pp. 323–325.*
Li, Hui–feng, et al., "Interffacial Characteristics of N2O and NO Nitrided SiO2 Grown on SiC by Rapid Thermal Processing", Appl. Phys. Lett, 70(15) Apr. 14, 1997.*
Lu, Chao–Yang, et al., "Effect of Process Variations and Ambient Temperature on Electron Mobility at the SiO2/4H Si–C Interface", IEEE Transactions on Electron Devices, vol. 50, No. 7, Jul. 2003, pp. 1582–1588.*
Li, Hui–Feng, et al, "Analysis of Fowler–Nordheim Injection in NO Nitrided Gate Oxide Grown on n–type 4H–SiC", Proc. 22nd Int'l Conf. on Microelectronics (MIEL 2000) vol. 1, Nis Serbia, May 14–17, 2000, pp. 331–333.*
Chung, G.Y., et al., "Improved Inversion Channel Mobility for 4H–SiC MOSFETs Following High Temperature Anneals in Nitric Oxide", IEEE Electron Device Letters, vol. 22, No. 4, Apr. 2001, pp. 176–178.*

(Continued)

Primary Examiner—George Fourson
(74) Attorney, Agent, or Firm—Morris Manning & Martin; Tim Tingkang Xia, Esq.

(57) ABSTRACT

A method for manufacturing a silicon carbide semiconductor device. In one embodiment, the method includes the following steps: a layer of silicon dioxide is formed on a silicon carbide substrate to create a silicon dioxide/silicon carbide interface and then nitrogen is incorporated at the silicon dioxide/silicon carbide interface for reduction in an interface trap density. The silicon carbide substrate, in one embodiment, includes a n-type 4H-silicon carbide.

15 Claims, 6 Drawing Sheets

OTHER PUBLICATIONS

Li, Hui–Feng, "Distribution and Chemical Bonding of N at NO Nitrided SiC/SiO2 Interface", IEEE 1999 pp. 164–166.*

Dimitrijev, S. et al, "Nitridation of Sillicon–Dioxide Films Grows on 6H Silicon Carbide", IEEE Electron Device Letters, vol. 18, No. 5, May 1977, pp. 175–177.*

Williams, J.R. et al, "Passivation of the 4H–SiC/SiO2 Interface with Nitric Oxide", Materials Science Forum, vol. 389–393 (2002), pp. 967–972.

Chung, G.Y., et al, "Effect of Nitric Oxide Annealing on the Interface Trap . . . Silicon Carbide", App. Phys. Lett., vol. 76, No. 13, pp. 1713–1715.

Li, H.F. , et al, "Electrical Characteristics of NO Nitrided SiO2 Grown on p–type 4H–SiC", Proc. $21^{st}$ Intl. Conf. on Microelectronics (MIEL '97) Yugoslavia, 14–1 Sep. 1997, pp. 611–612.

Li. H., Dimitrijev, S., Harrison, H.B., Improved Realiability of NO–nitrided SiO2 grown on p–type 4H–SiC, Aug. 1998, IEEE Electron Device Letters, vol. 19, Issue 8, p. 279–281.*

Lai, P.T., Chakraborty, S., Chan, C.L., Cheng, Y.C., "Effects of nitridation and annealing on interface properties of thermaly oxidized SiO2/SiC metal–oxide–semiconductor system", Jun. 19, 2000, Applied Physics Letters, vol. 76, No. 25, p. 3744–3746.*

Lipkin, L.A., Palmour, J.W., "Insulator Investigation on SiC for Improved Reliability", Mar. 1999, IEEE Transactions on Electron Devices, vol. 46, No. 3, p. 525–532.*

Afanas'ev, V.V., "Electronic properties of SiO2/SiC interfaces", 1999, Microelectronic Engineering, vol. 48, pp. 241–248.*

* cited by examiner

INCLUSION OF NITROGEN AT THE SILICON DIOXIDE-SILICON CARBIDE INTERACE FOR PASSIVATION OF INTERFACE DEFECTS

This application claims the benefit under 35 U.S.C. §119(e) of U.S. Provisional Application No. 60/192,009, filed Mar. 24, 2000, which is incorporated herein by reference in its entirety.

STATEMENT REGARDING FEDERALLY SPONSORED RESEARCH OR DEVELOPMENT

This invention was made with government support under grant #MDA972 98-1-0007 awarded by the Defense Advanced Research Projects Agency (DARPA). The federal government has certain rights in the present invention.

BACKGROUND OF THE INVENTION

1. Field of the Invention

The present invention relates to silicon carbide semiconductor devices and methods for their construction. More specifically, the instant invention relates to silicon carbide semiconductor devices with a layer of silicon dioxide disposed on a silicon carbide substrate that have a region of substantial nitrogen concentration at the silicon dioxide-silicon carbide interface.

2. Description of the Related Art

Presently, the silicon (Si) metal-oxide-semiconductor field effect transistor (MOSFET) is the most commonly manufactured transistor in the world. Silicon carbide (SiC) MOSFETS are currently being developed because of superior material properties that provide high power generation, conditioning, transmission and the ability to operate at higher temperatures.

Like Si, SiC thermally oxidizes to form $SiO_2$. However, the oxidation kinetics and oxide interface of SiC are poorly understood in comparison to Si. The oxidation rate of SiC is lower than Si by more than a factor of 10. Furthermore, the quality of the $SiO_2$/SiC interface is also inferior to the $SiO_2$/Si interface. This problem causes low channel mobilities in SiC MOSFETS due to the density of interface states that exists in the band gap near the conduction band edge. Refinements in cleaning and oxidation techniques have improved the interface quality of $SiO_2$/SiC, but producing reliable devices will require additional improvements.

Oxynitride films on Si have superior device reliability, better dopant diffusion resistance and higher dielectric quality than pure oxide films. Methods for manufacturing oxynitride films on Si include annealing $SiO_2$/Si in $N_2O$ or NO, with NO believed to be the species responsible for nitrogen incorporation. Nitrogen is typically incorporated near the $SiO_2$/Si interface at concentrations of about $10^{15}$ $cm^{-2}$, although the actual profile is a complicated function of the gaseous species and the temperature cycle. The atomic process for nitrogen incorporation appears to involve NO interstitial diffusion through the oxide to the $SiO_2$/Si interface where a reaction takes place that forms an oxynitride film.

Initial studies of oxynitride films on 6H-SiC have shown a small improvement in MOS interface quality after NO anneal (reduction of the interface state and fixed charge densities takes place) but inferior MOS interface quality after $N_2O$ anneal. These results are surprising considering that nitrogen incorporation at the $SiO_2$/Si interface does not decrease the interface trap density. Secondary ion mass spectrometry (SIMS), reveals that NO anneal incorporates nitrogen near the $SiO_2$/4H-SiC interface.

Thus, there exists a need for a method that reduces interface trap density near the conduction band edge at the $SiO_2$/SiC interface. By increasing channel mobility, such a method would facilitate the manufacture of high quality SiC MOSFET devices.

SUMMARY OF THE INVENTION

The present invention addresses this need by providing a method that reduces interface trap density in silicon carbide MOS devices and a semiconductor device with reduced interface trap density. This is accomplished by incorporating nitrogen at the $SiO_2$/SiC interface.

In one aspect, the present invention provides a method for manufacturing a semiconductor device. A layer of silicon dioxide is formed on a silicon carbide substrate. Then, nitrogen is incorporated at the silicon dioxide/silicon carbide interface. In one embodiment, the silicon carbide substrate is 4H-SiC. In another embodiment, the silicon carbide substrate is 6H-SiC. In yet another embodiment, the silicon carbide substrate is doped with a p-type or n-type dopant.

The silicon dioxide layer is formed by cleaning and then oxidizing the silicon carbide substrate. Preferably, the silicon carbide substrate is cleaned with 10% HF and then thermally oxidized. In a preferred embodiment, the silicon carbide substrate is oxidized at between about 900° C. and about 1200° C. Preferably, the silicon dioxide layer is greater than about 10 Å thick.

In one embodiment, nitrogen is incorporated by annealing the semiconductor device in nitric oxide or nitrous oxide. Preferably, in this embodiment, the semiconductor device is annealed at between about 950° C. and about 1200° C. (more preferably, at about 1175° C.) for between about 1 and about 4 hours. In another embodiment, nitrogen is incorporated by annealing the semiconductor device in ammonia at about between 950° C. and about 1200° C. (more preferably, at about 1175° C.) for about 4 hours.

Preferably, the areal density of nitrogen at the silicon dioxide/silicon carbide interface is between about $0.5 \times 10^{14}$ $cm^{-2}$ and about 1 $1 \times 10^{16}$ $cm^{-2}$ (more preferably, between about $1 \times 10^{14}$ $cm^{-2}$ and about $2 \times 10^{15}$ $cm^{-2}$). In a preferred embodiment, the maximum concentration of nitrogen at the silicon dioxide/silicon carbide interface is about 0.5%.

In another aspect, the present invention provides a silicon carbide semiconductor device. The semiconductor device has a silicon carbide substrate with a layer of silicon dioxide disposed thereon. The silicon dioxide/silicon carbide interface is characterized by a region of substantial nitrogen concentration.

In one embodiment, the silicon carbide substrate is 4H-SiC. In another embodiment, the silicon carbide substrate is 6H-SiC. In yet another embodiment, the silicon carbide substrate is doped with a p-type or a n-type dopant. Preferably, the areal density of nitrogen at the silicon dioxide/silicon carbide interface is between about $0.5 \times 10^{14}$ $cm^{-2}$ and about $1 \times 10^{16}$ $cm^{-2}$ (more preferably, between about $1 \times 10^{14}$ $cm^{-2}$ and about $2 \times 10^{15}$ $cm^{-2}$).

In one preferred embodiment, the maximum concentration of nitrogen at the silicon dioxide/silicon carbide interface is about 0.5%. In another preferred embodiment, the layer of silicon dioxide is greater than about 10 Å thick.

DETAILED DESCRIPTION OF THE INVENTION

Reference will now be made in detail to preferred embodiments of the invention. While the invention will be described in conjunction with the preferred embodiments, it will be understood that is not intended to limit the invention to those preferred embodiments. To the contrary, it is intended to cover alternatives, modifications, and equivalents as may be included within the spirit and scope of the invention as defined by the appended claims.

Figure 1:
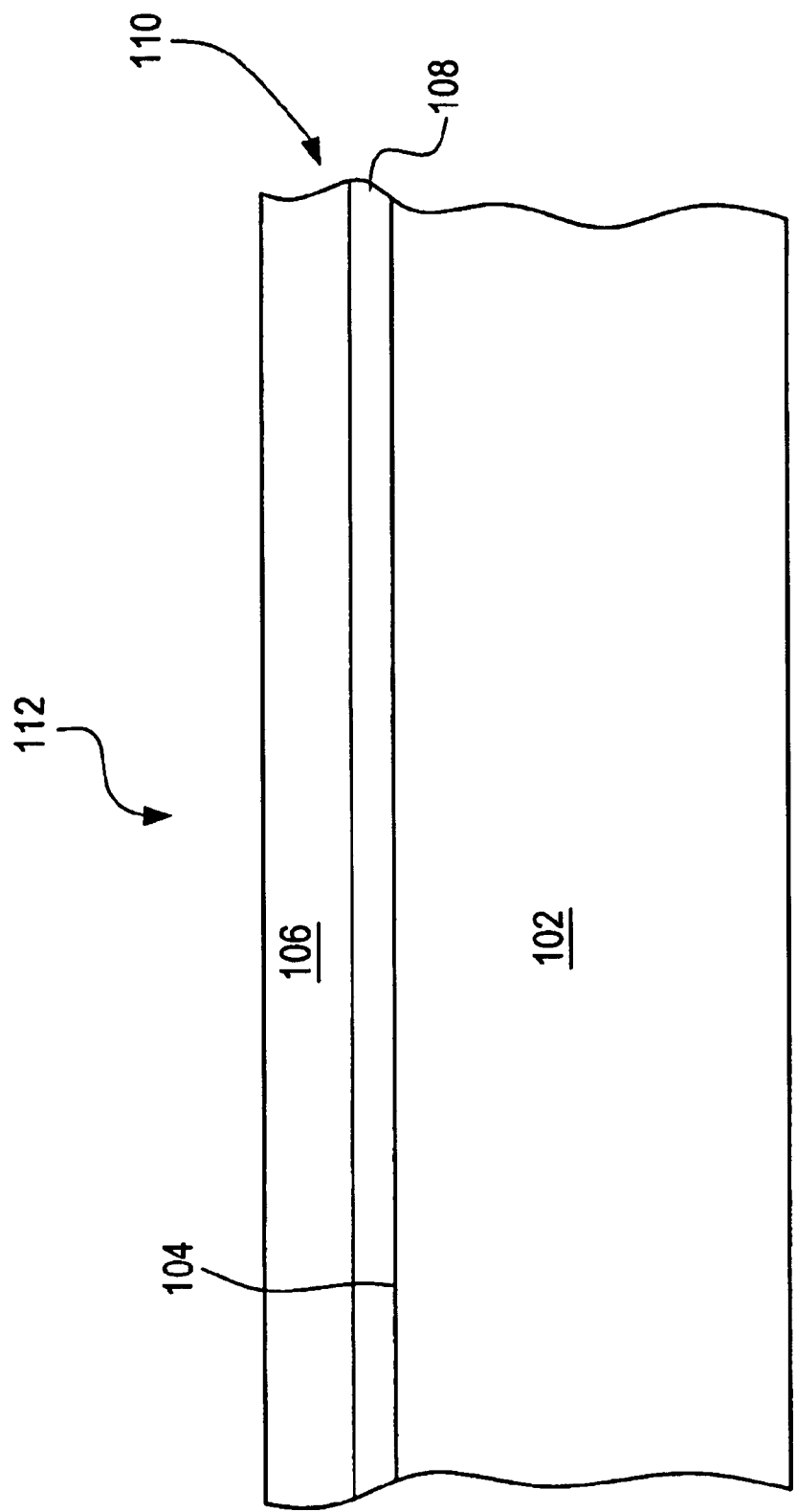
FIG. 1 schematically illustrates a $SiO_2$/SiC semiconductor device of the current invention.

FIG. 1 schematically illustrates a semiconductor device of the current invention. Semiconductor device 112 has a silicon dioxide layer 110 disposed on silicon carbide substrate 102. Silicon dioxide layer 110 consists of two different regions 106 and 108. Region 108, which is located at the SiO$_2$/SiC interface 104, is a region of substantial nitrogen concentration. The nitrogen concentration of region 106 is substantially lower than the nitrogen concentration of region 108.

Preferably, silicon dioxide layer 110 is greater than about 200 Å thick. Preferably, region 106 is between about 200 Å thick and about 1000 Å thick (more preferably, between about 300 Å thick and about 500 Å thick). Preferably, region 108 is between about 10 Å thick and about 30 Å thick (more preferably, between about 20 Å thick and about 30 Å thick).

The silicon carbide substrate 102 is 4H-SiC or 6H-SiC (preferably, 4H-SiC) and may be doped with either a p-type or a n-type dopant. The silicon carbide substrate 102 may also include an epitaxial layer. Preferably, the areal density of nitrogen at the silicon dioxide/silicon carbide interface 104 is between about $0.5\times10^{14}$ cm$^{-2}$ and about $1\times10^{16}$ cm$^{-2}$ (more preferably, between about $1\times10^{14}$ cm$^{-2}$ and about $2\times10^{15}$ cm$^{-2}$). The nitrogen concentration at the silicon dioxide/silicon carbide interface is between about $10^{22}$/cm$^3$ and about $10^{20}$/cm$^3$. The maximum concentration of nitrogen at the silicon dioxide/silicon carbide interface is about 0.5%.

The semiconductor device shown in FIG. 1 may be made by methods well known to those of ordinary skill in the art. For example, silicon dioxide may be deposited on a silicon carbide substrate by conventional deposition methods. The device may then be annealed with a nitrogen containing gas to provide a region of high nitrogen concentration such as area 108 at the SiO$_2$/SiC interface 104.

The silicon carbide substrate is 4H-SiC or 6H-SiC (preferably, 4H-SiC) and may be doped with either a p-type or a n-type dopant. The layer of silicon dioxide is preferably formed by cleaning the silicon carbide substrate followed by oxidation of the silicon carbide substrate. Preferred cleaning procedures include standard organic, heavy metals and RCA cleaning methods. Preferably, the silicon carbide substrate is cleaned with 10% HF. In a preferred embodiment, the silicon carbide substrate is thermally oxidized using standard wet or dry techniques. Preferably, the silicon carbide substrate is oxidized at between about 900° C. and about 1200° C. (more preferably, between about 1050° C. and about 1200° C.).

Nitrogen may be incorporated at the silicon carbide silicon dioxide interface by annealing in the presence of a nitrogen containing gas. Preferably, the nitrogen containing gas is nitric oxide, nitrous oxide or ammonia. When the nitrogen containing gas is nitric oxide, nitrous oxide or ammonia, the semiconductor device is annealed at between about 950° C. and about 1200° C. (more preferably, between about 1050° C. and about 1200° C., (most preferably, at about 1175° C.)) for between about 1 and about 4 hours.

Preferably, the areal density of nitrogen at the silicon dioxide/silicon carbide interface 104 is between about $0.5\times10^{14}$ cm$^{-2}$ and about $1\times10^{16}$ cm$^{-2}$ (more preferably, between about $1\times10^{14}$ cm$^{\times 2}$ and about $2\times10^{15}$ cm$^{\times 2}$). The nitrogen concentration at the silicon dioxide/silicon carbide interface is between about $10^{20}$/cm$^3$ and about $10^{22}$/cm$^3$. The maximum concentration of nitrogen at the silicon dioxide/silicon carbide interface is about 0.5%.

EXAMPLES

The invention having been described, the following examples are presented to illustrate, rather than limit, the scope of the invention. The examples illustrate various embodiments and features of the present invention.

Example 1

Preparation of Annealed 4H-SiC Wafers

Preparation of silicon-faced (8° off axis) 4H-SiC wafers with a p-type substrate and epitaxial layer, doped at about $2\times10^{16}$ cm$^{-3}$ and n-type (100) Si wafers with a resistivity of about 10 Ω-cm required etching in a 10% HF solution to remove native oxide and thermal oxidation in a resistively heated quartz tube furnace. The 4H-SiC wafers were oxidized in wet oxygen (oxygen bubbled through deionized water at about 85–90° C. at a flow rate of about 1.0l/mm. The 4H-SiC wafers were then loaded in a wet oxidizing ambient at about 850° C., the temperature was raised to about 1150° C. and the samples were oxidized for about 30 minutes in accordance with prior art techniques. The ambient was then switched to argon, the temperature was lowered to about 800° C. and the SiC wafers were removed from the furnace. The oxide thickness for the SiC wafers was about 30 nm.

When annealing was carried out with $^{15}$N containing gases the following conditions were typically employed. The 4H-SiC wafers were annealed in a resistively heated quartz tube furnace in 99.7% $^{15}$N$^{18}$O or $^{15}$N$_2$O at a static pressure of about 10 mbar at about 1000° C. for either about 1 or about 4 hours. Alternatively, the 4H-SiC wafers were annealed in 99.7% $^{15}$NH$_3$ at a static pressure of about 10 mbar at about 1100° C. for about 4 hours.

However, when annealing was carried out with $^{14}$N containing gases different conditions were typically employed. Annealing was preferably carried out at gas flow rates of about 0.5 l/min at atmospheric pressure and at temperatures between about 1000° C. and about 1200° C. for between about one and about six hours.

Example 2

Preparation of Annealed 4H-Si Wafers

Si wafers were oxidized in dry oxygen (<2ppm H$_2$O) at a flow rate of about 1 l/min, loaded in a oxidizing ambient at about 900° C. and oxidized at about 900° C. for about 25 minutes. The ambient was then switched to argon, and the Si wafers were removed from the furnace. The oxide thickness for Si wafers was about 20 nm.

The Si wafers were then annealed in a resistively heated quartz tube furnace with 99.7% $^{15}$N$^{18}$O or $^{15}$N$_2$O at a static pressure of about 10 mbar at about 1000° C. for either about 1 or about 4 hours. When annealing was carried out with $^{14}$N containing gases the conditions specified above were typically used. Anneals were preferably carried out at gas flow rates of about 0.5 l/min at atmospheric pressure, at temperatures between about 1000° C. and about 1200° C. for between about one and about six hours.

Example 3

Measurement of Areal Densities

The areal densities of $^{15}$N and $^{18}$O of annealed Si/C and Si wafers prepared as described in Examples 1 and 2 were determined by Nuclear Reaction Analysis (NRA) using the reactions $^{15}$N(p,αγ) $^{12}$C at E$_p$=1 MeV and $^{18}$O(p,αγ)$^{15}$N at E$_p$=730 keV. The $^{15}$N and $^{18}$O depth profiles were determined by nuclear resonance profiling (NRP) using the resonances in the reactions $^{15}$N(p,αγ)$^{12}$C at 429 keV and $^{18}$O(p,α)$^{15}$N at 151 keV, respectively, and a tilted sample geometry (ψ=65°). The measured excitation curves (γ or a yield versus incident proton energy) around the resonance energy were converted into concentration versus depth profiles. Table 1, shown below summarizes oxidation conditions, anneal times, oxide thickness and areal densities for a number of experiments.

TABLE 1

| Material | Oxidation Conditions | $^{15}$N $^{18}$O Anneal Time (hours) | $^{15}$N Areal Density (10$^{15}$ cm$^{-2}$) | $^{18}$O Areal Density (10$^{15}$ cm$^{-2}$) | Oxide Thickness (nm) |
|---|---|---|---|---|---|
| Si | 900° C.-Dry | 1 | 1.6 | 19.6 | 20.3 |
| Si | 900° C.-Dry | 4 | 2.2 | 44.6 | 22.8 |
| SiC | 1150° C.-Wet | 1 | 0.1 | 15.9 | 28.9 |
| SiC | 1150° C.-Wet | 4 | 0.2 | 51.0 | 27.6 |

Figure 2:
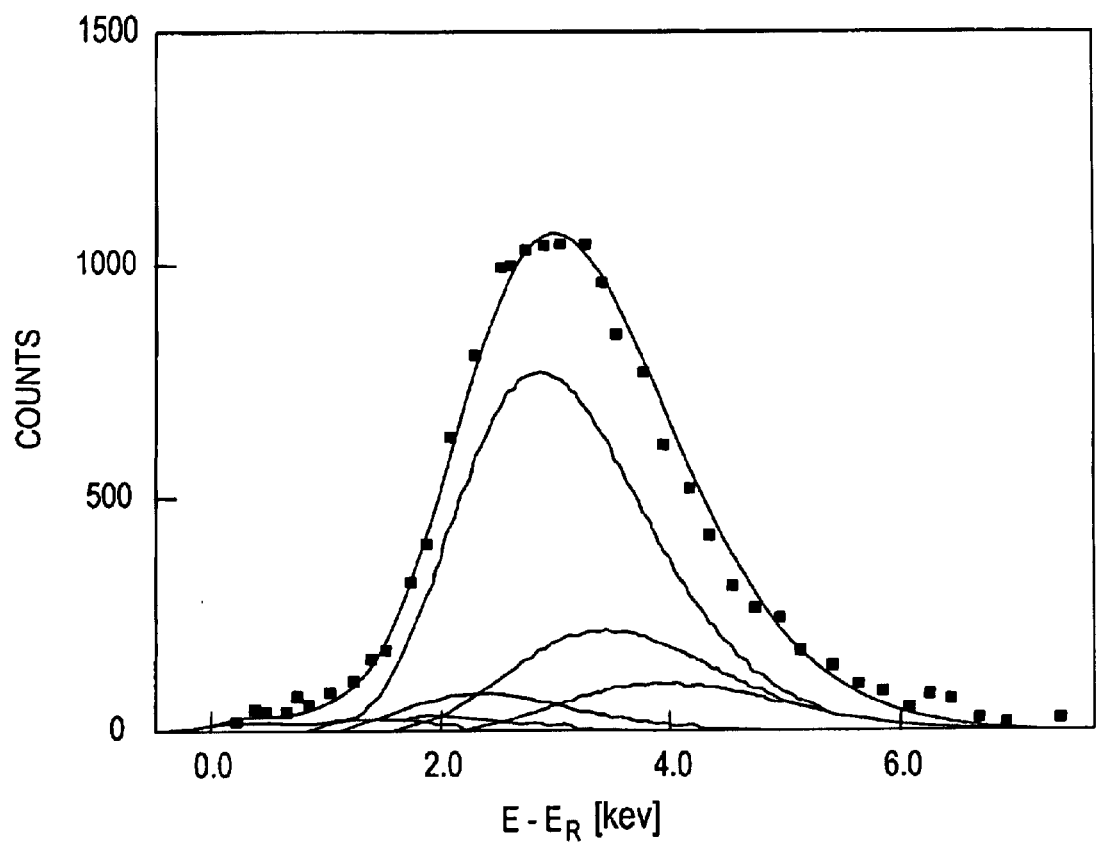
FIG. 2 is an excitation curve of the nuclear reaction of $^{15}N(p,\alpha\gamma)$ $^{12}C$ ($E_R$=429 keV) for SiO$_2$/SiC annealed in 10 mbar of $^{15}N^{18}O$ at 1000° C. for 4 h. The dots are the experimental data and the lines are the simulated excitation curves, components and sum, assuming the $^{15}N$ profiles shown in FIG. 4.
Figure 4:
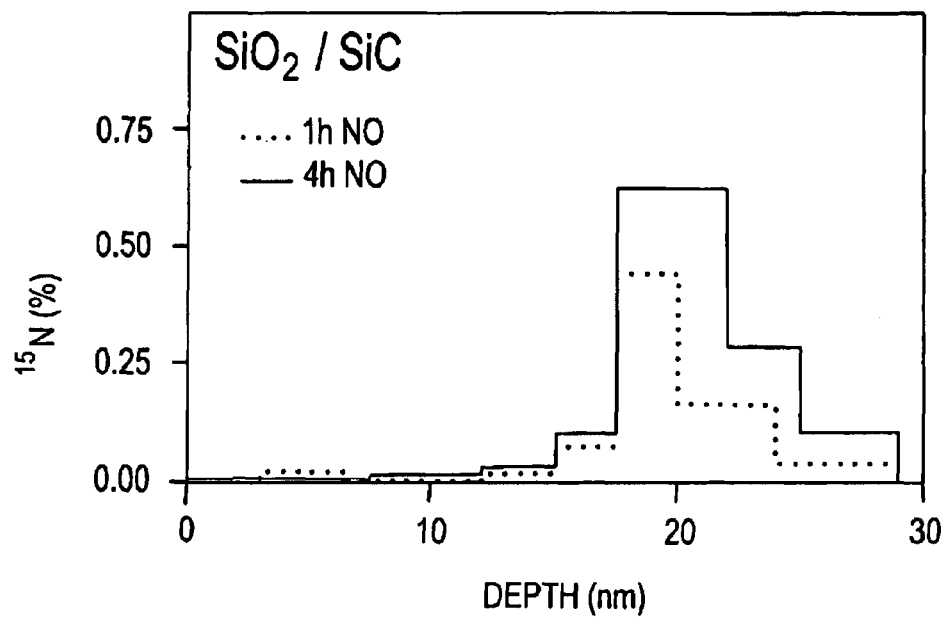
FIG. 4 is the concentration profile of $^{15}N$ in SiO$_2$/SiC annealed in 10 mbar of $^{15}N^{18}O$ at 1000° C. for 1 h (dotted) and 4 h (solid). The origin corresponds to the surface and the SiO$_2$/SiC interface is at about 30 nm.
Figure 5:
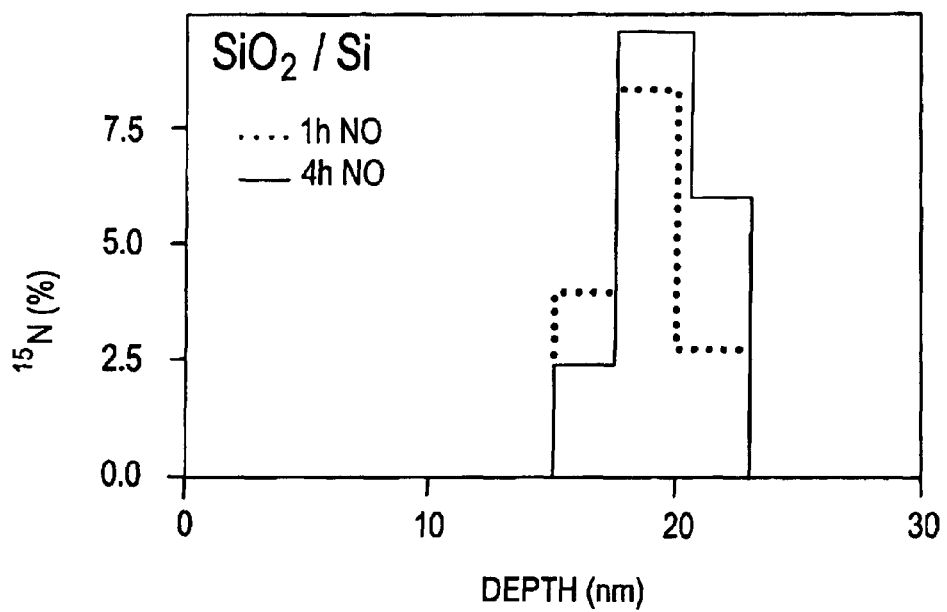
FIG. 5 is the concentration profile of $^{15}N$ in SiO$_2$/Si annealed in 10 mbar of $^{15}N^{18}O$ at 1000° C. for 1 h (dotted) and 4 h (solid). The origin corresponds to the surface and the SiO$_2$/Si interface is at about 20 nm.

An excitation curve and its simulation for the $^{15}$N(p,αγ) $^{12}$C reaction in a SiO$_2$/SiC sample annealed in $^{15}$N$^{18}$O are shown in FIG. 2. The obtained depth profiles of $^{15}$N in the SiO$_2$/SiC samples (FIG. 4) are similar to the profiles in the SiO$_2$/Si samples (FIG. 5). Nitrogen is concentrated primarily at the SiO$_2$/SiC interface at about 30 nm. The width of the N profile is larger in the SiO$_2$/SiC samples than in the SiO$_2$/Si samples, which suggests that the SiO$_2$/SiC interface is rougher than the SiO$_2$/Si interface. These depth profiles, determined by nuclear resonance profiling, provide independent verification of SIMS results, which showed nitrogen located near the interface.

The $^{15}$N areal density in SiO$_2$/SiC wafers is about 10$^{14}$ cm$^{-2}$ for both anneal times (see Table 1), and the maximum nitrogen concentration is about 0.5% (see FIG. 4) when the wafers are annealed in $^{15}$N$^{18}$O. Both of these values are much smaller than SiO$_2$/Si wafers, where the $^{15}$N areal density is about 10$^{15}$ cm$^{-2}$ and the maximum concentration is about 10%. The rate of nitrogen incorporation in both SiO$_2$/SiC and SiO$_2$/Si wafers is related to their relative oxidation rates, which suggests that the rate of Si-N bonding at the interface is governed by the same factors as the oxidation rate in each material.

Figure 3:
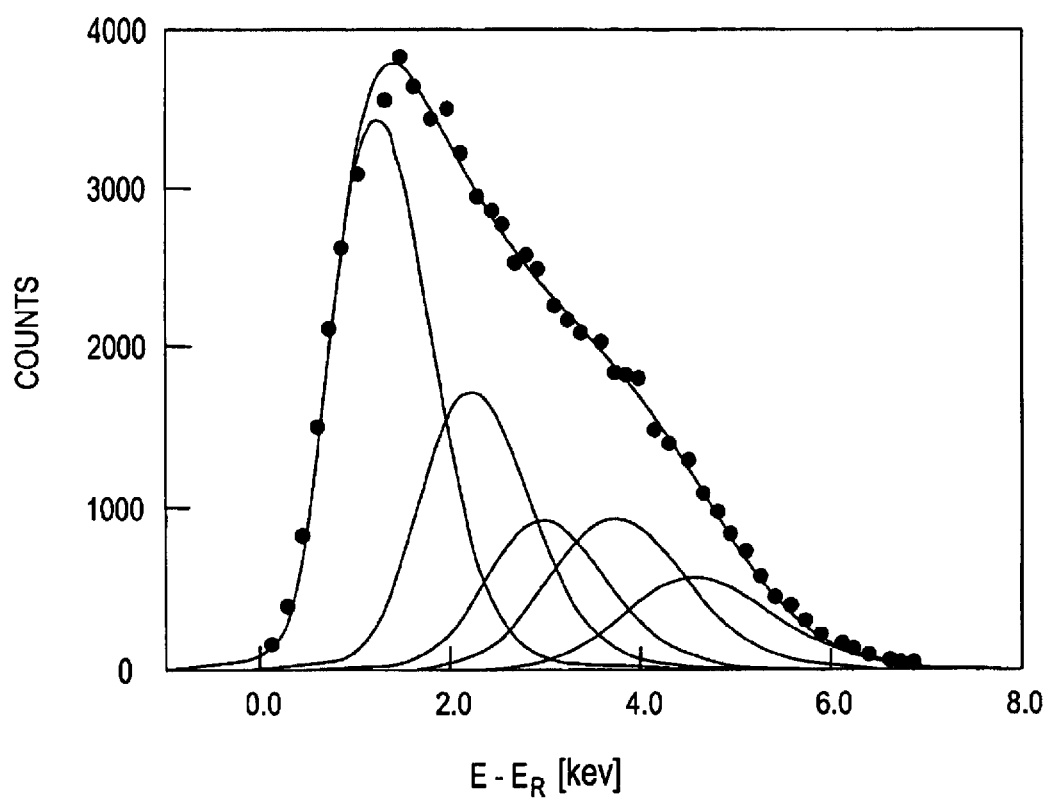
FIG. 3 is an excitation curve of the nuclear reaction of $^{18}O(p,\alpha)^{15}N$ ($E_R$=151 keV) for SiO$_2$/SiC annealed in 10 mbar of $^{15}N^{18}O$ at 1000° C. for 4 h. The dots are the experimental data and the lines are the simulated excitation curves, components and sum, assuming the $^{18}O$ profiles shown in FIG. 6.
Figure 6:
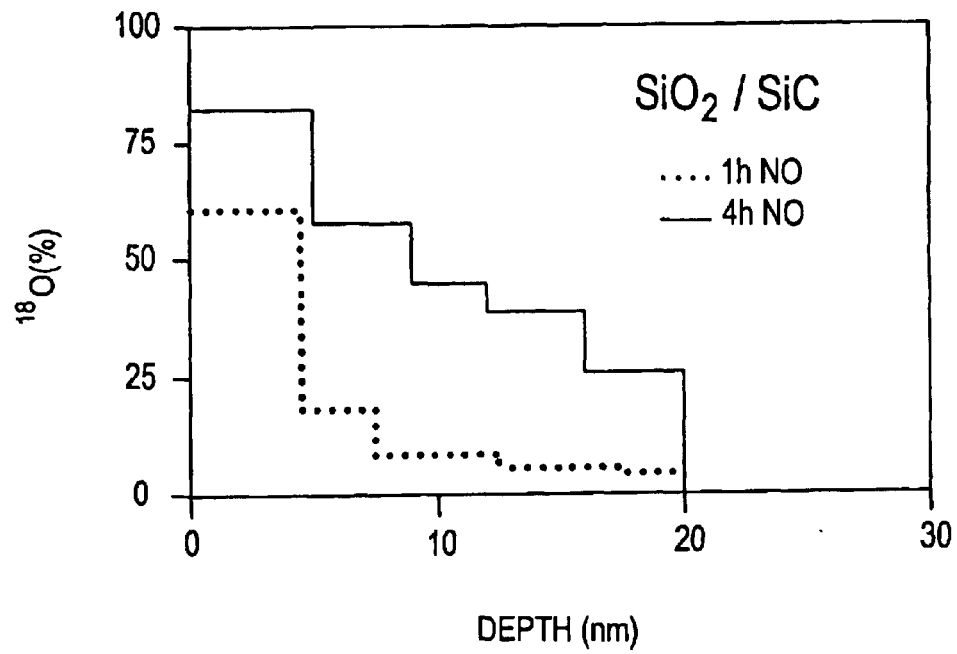
FIG. 6 is a concentration profile of $^{18}O$ in SiO$_2$/SiC annealed in 10 mbar of $^{15}N^{18}O$ at 1000° C. for 1 h (dotted) and 4 h (solid). The origin corresponds to the surface and the $^{18}O$ gradient is due to the surface exchange reaction.
Figure 7:
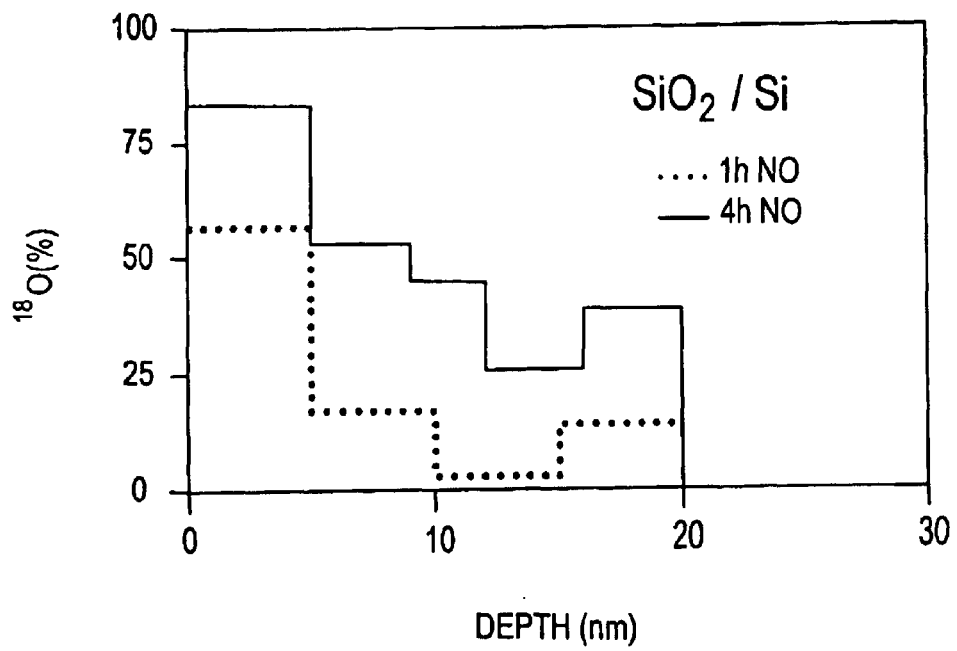
FIG. 7 is a concentration profile of $^{18}O$ in SiO$_2$/Si annealed in 10 mbar of $^{15}N^{18}O$ at 1000° C. for 1 h (dotted) and 4 h (solid). The origin corresponds to the surface and the $^{18}O$ gradient is due to the surface exchange reaction.

An excitation curve and its simulation for the $^{18}$O(p,α) $^{15}$N reaction in a SiO$_2$/SiC wafer annealed in $^{15}$N$^{18}$O are shown in FIG. 3. The $^{18}$O depth distributions in the SiO$_2$/SiC wafers (FIG. 6) show a gradient of $^{18}$O in the oxide from the surface to the interface. These $^{18}$O profiles, as well as the $^{18}$O areal densities (see Table 1), strongly resemble those of the Si wafers (FIG. 7). In Si wafers however, $^{18}$O accumulates at the interface, while little or no new oxidation occurs in SiC wafers. These results confirm the difference in oxidation rates of SiC and Si and indicate that the surface exchange mechanism is identical for oxides on SiC and Si. Since the exchange reaction is solely a characteristic of the oxide and not the substrate, this was further evidence of similar chemical behavior of oxide on SiC and Si substrates.

In SiO$_2$/SiC wafers annealed in $^{15}$N$_2$O, the amount of nitrogen incorporated is about 10$^{13}$ cm$^{-2}$, which is near the detection limit of NRA and prevents resonance profiling. The amount of incorporated nitrogen is again an order of magnitude smaller than the amount of nitrogen in the SiO$_2$/Si samples, which is about 10$^{14}$ cm$^{-2}$.

The above results are particularly meaningful when the electrical properties of oxynitrides on SiC are considered. Previous studies showed that thermal annealing of SiO$_2$/6H-SiC in NO at 1100° C. modestly decreased the interface trap density (D$_{it}$), while N$_2$O anneal actually increased D$_{it}$. In contrast, the present invention demonstrates that rapid thermal annealing of SiO$_2$/4H-SiC in NO at 1100° C. significantly decreases the interface trap density (D$_{it}$).

A small but definite incorporation of nitrogen near the SiO$_2$/SiC interface from NO anneal and considerably less nitrogen incorporation from N$_2$O anneal is observed (see FIGS. 2–7). Thermal decomposition of NO at temperatures >1000° K. provides a fairly constant concentration of NO along with small amounts of N$_2$ and O$_2$. Conversely, N$_2$O readily decomposes into N$_2$ (about 60%), O$_2$ (about 25%), and NO (about 15%). The dominant reaction when oxide films are annealed in N$_2$O is dry oxidation of the substrate. Annealing in N$_2$O incorporates very little nitrogen at the interface because of the low NO concentration and leads to poor quality, dry oxidation of SiC, which provides a high interface trap density. The re-oxidation technique (annealing SiO$_2$/SiC, in wet oxygen at 950° C.) improves interface quality without appreciable new oxide growth by reducing D$_{it}$ near the middle of the band gap. Nitrogen incorporation at the SiO$_2$/4H-SiC interface may offer benefits similar to the re-oxidation anneal, by substantially reducing $D_{it}$ near the conduction band edge, which also could explain the different results in NO and $N_2O$ anneals.

Thus, annealing $SiO_2/SiC$ wafers in $N_2O$ incorporates less nitrogen (about $10^{13}$ cm$^{-2}$) while annealing in NO incorporates nitrogen near the $SiO_2/SiC$ interface with an areal density of about $10^{14}$ cm$^{-2}$ and an atomic concentration of about 0.5%. Annealing in $NH_3$ provides reductions in $D_{it}$ similar to those that are achieved using NO; however, $NH_3$ annealing incorporates nitrogen in the $SiO_2$ layer with a much higher areal density (about $10^{16}$ cm$^{-2}$).

Compared to $SiO_2/Si$, nitrogen incorporation is lower for $SiO_2/4H\text{-}SiC$ annealed in NO but higher for $SiO_2/4H\text{-}SiC$ annealed in $NH_3$. These values are an order of magnitude lower than comparably prepared $SiO_2/Si$ wafers. Like $SiO_2/Si$, a surface exchange of oxygen in the gas phase with the oxide followed by NO diffusion and reaction at the $SiO_2/SiC$ interface are observed after NO anneal. The surface exchange reaction for $SiO_2/SiC$ appears to be similar to $SiO_2/Si$ confirming that the oxides themselves are chemically similar. The incorporation of nitrogen at the interface provides a possible explanation for the electrical characteristics of NO, $NH_3$ and $N_2O$ annealed $SiO_2/4H\text{-}SiC$ wafers. In particular, the interface trap density near the conduction band in $SiO_2/4H\text{-}SiC$ wafers is substantially reduced after high temperature annealing in either NO and $NH_3$. These results suggest that any process that incorporates atomic nitrogen at the $SiO_2/SiC$ interface may reduce the interface trap density in $SiO_2/4H\text{-}SiC$ wafers. The process described above facilitates improvements in the channel mobility for inversion mode, n-channel MOSFETS, fabricated with 4H-SiC.

Example 4

Figure 8:
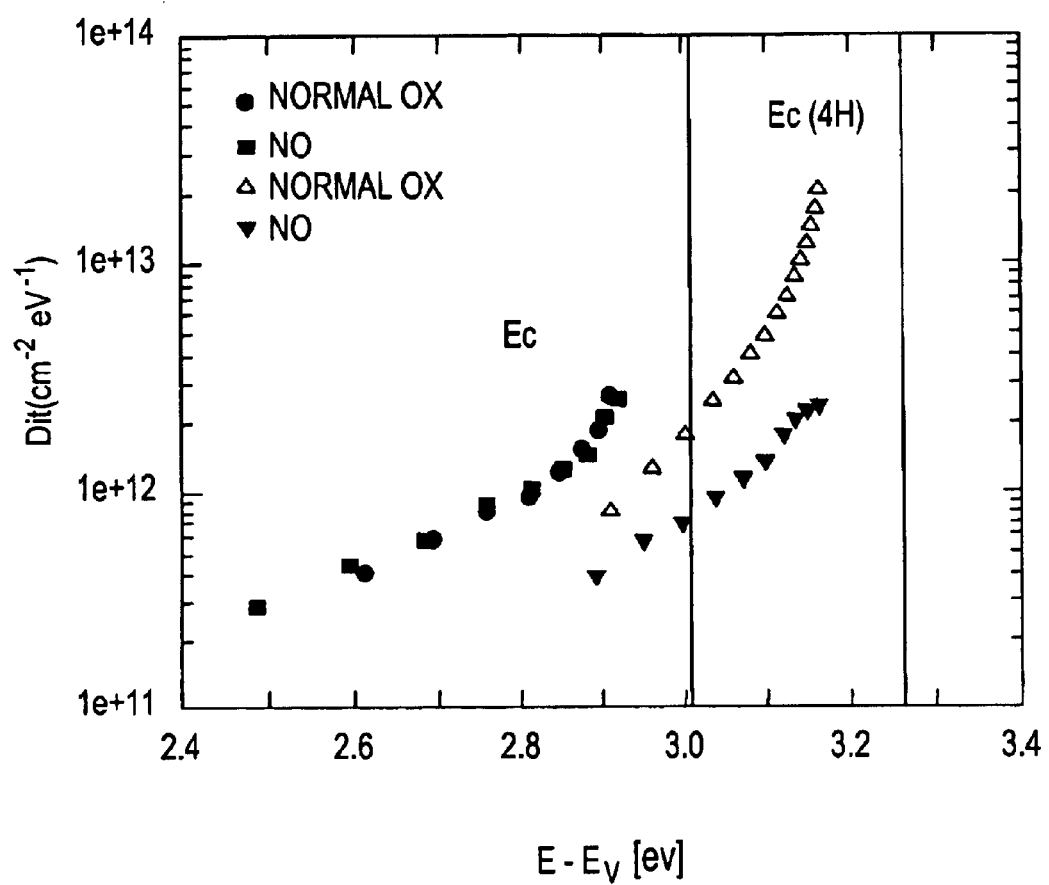
FIG. 8 illustrates the electrical effects of passivation techniques for SiO$_2$/6H-SiC and SiO$_2$/4H-SiC samples annealed in NO for about two hours at about 1100° C. Similar results are achieved with NH$_3$.

Comparison of Annealing of $SiO_2/6H\text{-}SiC$ and $SiO_2/4H\text{-}SiC$ Wafers FIG. 8 illustrates the effect of annealing $SiO_2/6H\text{-}SiC$ and $SiO_2/4H\text{-}SiC$ samples in nitric oxide (NO) and hence serves to show the electrical effects of the passivation techniques of the current invention. Similar results are observed using ammonia ($NH_3$) instead of NO. A reduction in the interface state density near the conduction band edge of approximately one order of magnitude is observed for the $SiO_2/4H\text{-}SiC$ sample compared to the $SiO_2/6H\text{-}SiC$ sample. This experimental observation is in agreement with prior art suggestions that indicate a large interface state density exists for all polytypes of SiC at around 2.9eV above the valence band edge. In 6H-SiC, these states lie mostly in the conduction band and hence are not affected by passivation techniques. However, 4H-SiC, the material of choice for SiC MOSFET fabrication, has a wider band gap than 6H-SiC (~3.3eV compared to ~3eV), and as a result, a much larger fraction of the interface states near 2.9eV lie in the band gap of 4H-SiC where they act to degrade channel mobility for n-channel, inversion mode devices through field termination, carrier (electron) trapping and Coulomb scattering. Therefore, the current invention, as shown in FIG. 8, by identifying passivation techniques for these states, significantly improves prospects for SiC MOSFET manufacture.

Finally, it should be noted that there are alternative ways of implementing both the process and apparatus of the present invention. For example, the silicon carbide semiconductor substrate may be annealed at different temperature, pressures or even with different nitrogen containing gases. The silicon carbide semiconductor device may contain regions of higher or lower nitrogen concentration at the silicon carbide/silicon dioxide interface than described in the present invention. Accordingly, the present embodiments are to be considered as illustrative and not restrictive, and the invention is not to be limited to the details given herein, but may be modified within the scope and equivalents of the appended claims.

What is claimed is:

1. A method for manufacturing a semiconductor device comprising the steps of:

forming a layer of silicon dioxide on a silicon carbide substrate to create a silicon dioxide/silicon carbide interface with an interface trap density; and incorporating nitrogen at the silicon dioxide/silicon carbide interface for reduction in the interface trap density, wherein the silicon carbide substrate comprises 4H-SiC and is doped with an n-type dopant.

2. The method of claim 1, wherein the step of forming the layer of silicon dioxide comprises the steps of:

cleaning the silicon carbide substrate; and oxidizing the silicon carbide substrate.

3. The method of claim 2, wherein the step of cleaning the silicon carbide substrate is performed with a solution having 10% HF in weight.

4. The method of claim 2, wherein the step of oxidizing the silicon carbide substrate is performed thermally.

5. The method of claim 4, wherein the silicon carbide substrate is oxidized at between about 900° C. and about 1150° C.

6. The method of claim 1, wherein the layer of silicon dioxide is greater than about 10 Å thick.

7. The method of claim 1, wherein the nitrogen is incorporated by annealing the semiconductor device in nitric oxide or nitrous oxide.

8. The method of claim 7, wherein the semiconductor device is annealed at between about 950° C. and about 1200° C. for between about 1 and about 4 hours.

9. The method of claim 8, wherein the semiconductor device is annealed at about 1175° C.

10. The method of claim 1, wherein the nitrogen is incorporated by annealing the semiconductor device is ammonia.

11. The method of claim 10, wherein the semiconductor device is annealed at about between 950° C. and about 1200° C. for about 4 hours.

12. The method of claim 11, wherein the semiconductor device is annealed at about between 1175° C.

13. The method of claim 1, wherein an areal density of nitrogen at the silicon dioxide/silicon carbide interface is between about $0.5 \times 10^{14}$ cm$^{-2}$ and about $1 \times 10^{16}$ cm$^{-2}$.

14. The method of claim 13, wherein the areal density of nitrogen at the silicon dioxide/silicon carbide interface is between about $1 \times 10^{14}$ cm$^{-2}$ and about $2 \times 10^{15}$ cm$^{-2}$.

15. The method of claim 1, wherein the maximum concentration of nitrogen at the silicon dioxide/silicon carbide interface is about 0.5%.

* * * * *

UNITED STATES PATENT AND TRADEMARK OFFICE
CERTIFICATE OF CORRECTION

PATENT NO. : 6,939,756 B1　　　　　　　　　　　　　　　　　　　　　　　　　　Page 1 of 1
APPLICATION NO. : 09/818193
DATED : September 6, 2005
INVENTOR(S) : Gilyong Chung et al.

It is certified that error appears in the above-identified patent and that said Letters Patent is hereby corrected as shown below:

In the Title:

"Inclusion Of Nitrogen At The Silicon Dioxide-Silicon Carbide Interace For Passivation Of Interface Defects" should read -- Inclusion Of Nitrogen At The Silicon Dioxide-Silicon Carbide Interface For Passivation Of Interface Defects --.

Signed and Sealed this

Thirteenth Day of July, 2010

David J. Kappos
*Director of the United States Patent and Trademark Office*